United States Patent
Chu et al.

(10) Patent No.: US 8,723,160 B2
(45) Date of Patent: May 13, 2014

(54) LIGHT EMITTING DIODE (LED) DIE HAVING PERIPHERAL ELECTRODE FRAME AND METHOD OF FABRICATION

(71) Applicant: SemiLEDS Optoelectronics Co., Ltd., Chu-Nan (TW)

(72) Inventors: Chen-Fu Chu, Hsinchu (TW); Feng-Hsu Fan, Jhonghe (TW); Hao-Chun Cheng, Pingtung County (TW); Trung Tri Doan, Baoshan (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 13/644,381

(22) Filed: Oct. 4, 2012

(65) Prior Publication Data
US 2013/0026448 A1    Jan. 31, 2013

Related U.S. Application Data

(63) Continuation-in-part of application No. 12/845,007, filed on Jul. 28, 2010, now Pat. No. 8,283,652.

(51) Int. Cl.
*H01L 29/06* (2006.01)

(52) U.S. Cl.
USPC .............. 257/14; 257/81; 257/84; 257/98; 257/99; 257/E27.12; 257/E33.008

(58) Field of Classification Search
USPC .................. 257/14, 81, 84, 98, 99
See application file for complete search history.

(56) References Cited

U.S. PATENT DOCUMENTS

| | | | |
|---|---|---|---|
| 5,977,565 A | 11/1999 | Ishikawa et al. | |
| 6,650,018 B1 | 11/2003 | Zhao et al. | |
| 6,870,191 B2 | 3/2005 | Niki et al. | |
| 6,897,494 B1 | 5/2005 | Chen et al. | |
| D534,506 S | 1/2007 | Lai | |
| 7,358,544 B2 | 4/2008 | Sakamoto et al. | |
| 7,560,738 B2 | 7/2009 | Liu | |
| D606,949 S | 12/2009 | Liu | |
| 8,283,652 B2 | 10/2012 | Chu et al. | |
| 2004/0026702 A1* | 2/2004 | Yamada et al. | 257/80 |
| 2005/0173692 A1 | 8/2005 | Park et al. | |
| 2006/0060868 A1 | 3/2006 | Orita | |
| 2007/0018187 A1 | 1/2007 | Lee et al. | |
| 2007/0029569 A1 | 2/2007 | Andrews | |
| 2007/0108519 A1* | 5/2007 | Ito et al. | 257/340 |

(Continued)

OTHER PUBLICATIONS

Office Action from U.S. Appl. No. 12/845,007 dated Feb. 16, 2012, pp. 1-14.

(Continued)

*Primary Examiner* — A. Sefer
(74) *Attorney, Agent, or Firm* — Stephen A. Gratton

(57) ABSTRACT

A light emitting diode (LED) die includes a first-type semiconductor layer, a multiple quantum well (MQW) layer and a second-type semiconductor layer. The light emitting diode (LED) die also includes a peripheral electrode on the first-type semiconductor layer located proximate to an outer periphery of the first-type semiconductor layer configured to spread current across the first-type semiconductor layer. A method for fabricating the light emitting diode (LED) die includes the step of forming an electrode on the outer periphery of the first-type semiconductor layer at least partially enclosing and spaced from the multiple quantum well (MQW) layer configured to spread current across the first-type semiconductor layer.

20 Claims, 6 Drawing Sheets

(56) References Cited

U.S. PATENT DOCUMENTS

| | | |
|---|---|---|
| 2007/0221944 A1 | 9/2007 | Cheol |
| 2009/0026468 A1 | 1/2009 | Sakai et al. |
| 2009/0114929 A1 | 5/2009 | Lee et al. |
| 2010/0051987 A1* | 3/2010 | Katsuno et al. ............ 257/98 |
| 2010/0051994 A1* | 3/2010 | Katsuno et al. ............ 257/98 |
| 2010/0163894 A1 | 7/2010 | Uemura et al. |
| 2010/0163904 A1* | 7/2010 | Park ............................ 257/98 |
| 2010/0226404 A1 | 9/2010 | Kim et al. |
| 2010/0278207 A1 | 11/2010 | Sonobe et al. |
| 2011/0284875 A1 | 11/2011 | Edmond et al. |
| 2012/0012871 A1 | 1/2012 | Hsia et al. |

OTHER PUBLICATIONS

Notice of Allowance from U.S. Appl. No. 12/845,007, dated Jun. 12, 2012, pp. 1-10.

* cited by examiner

LIGHT EMITTING DIODE (LED) DIE HAVING PERIPHERAL ELECTRODE FRAME AND METHOD OF FABRICATION

CROSS REFERENCE TO RELATED APPLICATIONS

This application is a continuation-in-part of Ser. No. 12/845,007 filed Jul. 28, 2010, U.S. Pat. No. 8,283,652 B2.

BACKGROUND

This disclosure relates generally to optoelectronic components and more particularly to light emitting diode (LED) dice, and to methods for fabricating the dice.

A light emitting diode (LED) die can include a multi-layer semiconductor substrate made of a compound semiconductor material, such as GaN. The semiconductor substrate can include a p-type semiconductor layer having p-type dopants, an n-type semiconductor layer having n-type dopants, and a multiple quantum well (MQW) layer located between the semiconductor layers configured to emit light. The light emitting diode (LED) die can also include electrodes for supplying current for activating the multiple quantum well (MQW) layer to emit light.

One problem that can occur in a light emitting diode (LED) die is that current can accumulate on specific areas of a semiconductor layer, particularly near an electrode, limiting the efficiency of the multiple quantum well (MQW) layer. This problem, which is sometimes referred to as "current crowding", requires higher forward bias (Vf), and also increases power consumption and heat output. One prior art approach to this problem is to form the electrodes with a number of legs that spread out the current. However, this approach tends to cover a large area of the multiple quantum well (MQW) layer limiting brightness. The present disclosure is directed to a light emitting diode (LED) die having an electrode frame configured to spread current and to a method for fabricating the light emitting diode (LED) die.

SUMMARY

A light emitting diode (LED) die includes a first-type semiconductor layer, a multiple quantum well (MQW) layer on the first-type semiconductor layer configured to emit electromagnetic radiation, and a second-type semiconductor layer on the multiple quantum well layer (MQW) having a polarity opposite to that of the first-type semiconductor layer. The light emitting diode (LED) die also includes a peripheral electrode on the first-type semiconductor layer located proximate to an outer periphery of the first-type semiconductor layer at least partially enclosing and spaced from the multiple quantum well (MQW) layer configured to spread current from the outer periphery towards a center of the first-type semiconductor layer.

A method for fabricating the light emitting diode (LED) die includes the step of providing a first-type semiconductor layer having an outer periphery, a multiple quantum well (MQW) layer on the first-type semiconductor layer configured to emit electromagnetic radiation, and a second-type semiconductor layer on the multiple quantum well (MQW) layer having a polarity opposite to that of the first-type semiconductor layer. The method also includes the step of forming an electrode along the outer periphery of the first-type semiconductor layer at least partially enclosing and spaced from the multiple quantum well (MQW) layer configured to spread current across the first-type semiconductor layer.

DETAILED DESCRIPTION

Figure 1:
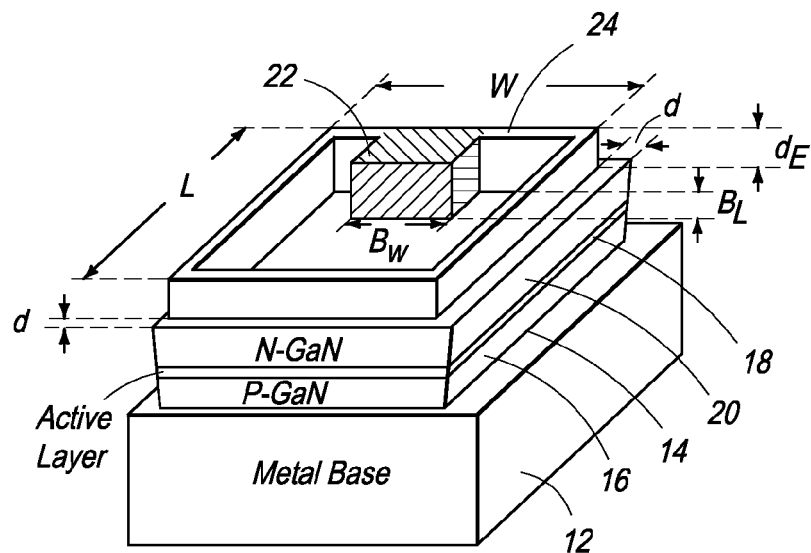
FIG. 1 is a schematic perspective view of a vertical light emitting diode (VLED) die having an electrode frame.

Referring to FIG. 1, a vertical light emitting diode (VLED) die 10 (FIG. 1A) includes a metal base 12; a mirror 14 on the metal base 12; a p-type semiconductor layer 16 on the first metal base; a multiple quantum well (MQW) layer 18 (active layer) on the p-type semiconductor layer 16; and an n-type semiconductor layer 20 on the multiple quantum well (MQW) layer 18. The vertical light emitting diode die (VLED) 10 also includes a electrode 22, and an electrode frame 24 on the n-type semiconductor layer 20 in electrical contact with the electrode 22.

The metal base 12, the mirror 14 on the metal base 12, the p-type semiconductor layer 16, the multiple quantum well (MQW) layer 18, and the n-type semiconductor layer 20 are all generally rectangular in peripheral shape. In addition, the electrode frame 24 has a four-sided picture frame shape comprised of two parallel spaced width side walls, and two parallel spaced length side walls orthogonal to the width side walls, contained within the peripheral outline of the n-type semiconductor layer 20. In other words, the electrode frame 24 has a peripheral length, a peripheral width and a peripheral area that are less than the length, the width and the area of the n-type semiconductor layer 20. In addition, as will be further explained, the electrode frame 24 has a peripheral length, a peripheral width and a peripheral area that are greater than (or equal to) the length, the width and the area of the mirror 14, which reduces light blocking by the electrode frame 24.

The metal base 12 (FIG. 1) can have an area greater than that of the a p-type semiconductor layer 16 and the n-type semiconductor layer 20. The metal base 12 can comprise a single metal layer or a stack of two or more metal layers, formed using a suitable deposition process. In addition, the material for the metal base 12 can be selected to provide a high electrical conductivity and a high thermal conductivity. Suitable materials for the metal base 12 include Cu, Ni, Ag, Au, Co, Cu—Co, Ni—Co, Cu—Mo, Ni/Cu, Ni/Cu—Mo and alloys of these metals. Suitable deposition processes for forming the metal base 12 include electro-deposition, electroless-deposition, chemical vapor deposition (CVD), plasma enhanced chemical vapor deposition (PECVD), physical vapor deposition (PVD), evaporation, and plasma spray.

The mirror 14 (FIG. 1) can be generally rectangular in shape with an area less than that of the p-type semiconductor layer 16. In addition to acting as a reflector, the mirror 14 functions as a anode electrode to provide a current path from the anode (p-type semiconductor layer 16) to the cathode (n-type semiconductor layer 20). The mirror 14 can comprise a single metal layer or stack of metals, such as Ag, Ni/Ag, Ni/Ag/Ni/Au, Ag/Ni/Au, Ti/Ag/Ni/Au, Ag/Pt or Ag/Pd or Ag/Cr, formed by depositing an alloy containing Ag, Au, Cr, Pt, Pd, or Al. A thickness of the mirror 14 can be less than about 1.0 µm. High temperature annealing or alloying can also be used to improve the contact resistance and adhesion of the mirror 14.

The p-type semiconductor layer 16 (FIG. 1) can be generally rectangular in shape with an area greater than that of the mirror 14. A preferred material for the p-type semiconductor layer 16 comprises p-GaN. Other suitable materials for the p-type layer include AlGaN, InGaN and AlInGaN. The multiple quantum well (MQW) layer 18 can comprise a semiconductor material, such as GaAs. As shown in FIG. 1, the multiple quantum well (MQW) layer 18 and the n-type semiconductor layer 20 can have a same rectangular shape as the p-type semiconductor layer 16 but with an decreasing area, such that an epitaxial stack having sloped sidewalls is formed by the semiconductor layers 16, 20 and the multiple quantum well (MQW) layer 18. Stated differently, an epitaxial stack formed by the n-type semiconductor layer 20, the multiple quantum well (MQW) layer 18 and the p-type semiconductor layer 16 is generally pyramidal in shape with the n-type semiconductor layer 20 forming a base and the p-type semiconductor layer forming a flat top. The upper surface of the n-type semiconductor layer 20 can also be flat and planar to provide a base for the electrode frame 24. A preferred material for the n-type semiconductor layer 20 comprises n-GaN. Other suitable materials for the n-type layer include AlGaN, InGaN and AlInGaN.

As will become more apparent as the description proceeds, the geometry of the elements of the vertical light emitting diode (VLED) die 10 (FIG. 1) provide improved performance. For example, with the area of the n-type semiconductor layer 20 greater than the areas of the multiple quantum well (MQW) layer 18, the p-type semiconductor layer 16 and the mirror 14, light blocking is reduced. In particular, the larger area of the n-type semiconductor layer 20 allows the electrode frame 24 to be formed on the n-type semiconductor layer 20 with less light blockage. In addition, as the mirror 14 has the smallest area, current blocking by the mirror 14 is reduced.

The electrode 22 (FIG. 1) can comprise a pad in contact with a side of the electrode frame 24 and having a rectangular or square peripheral outline contained within the electrode frame 24. In addition, the electrode 22 can be configured as a bond pad for wiring bonding to the vertical light emitting diode (VLED) die 10 and to a corresponding support substrate (not shown). Further, the electrode 22 and the electrode frame 24 can comprise a single layer, or a stack of materials, formed using a suitable deposition process such as PVD, E-Gun evaporation, thermal evaporation, electro less chemical deposition, or electrical chemical deposition. Suitable materials for the electrode 22 and the electrode frame 24 can include Ti/Al/Ni/Au, Al/Ni/Au, Al/Ni/Cu/Au and Ti/Al/Ni/Cu/Ni/Au.

In FIG. 1 the following geometrical features are identified. In addition representative dimensions are listed below.
W: The width of the outer periphery of the electrode frame 24 (1 µm~1000 µm)
L: The length of the outer periphery of the electrode frame 24 (1 µm~25 mm (250000 µm))
E: The wall width of the electrode frame 24 (1 µm~100 µm)
d: The distance from the outer periphery of the electrode frame 24 to the edge of the n-type semiconductor layer 20 (1 µm~100 µm)
$d_E$: The thickness of the electrode frame 24 (1 µm~100 µm)
$B_w$: The width of the electrode 22 (10 µm~1000 µm)
$B_L$: The length of the electrode 22 (10 µm~300 µm)
The height of electrode 22 is the same as $d_E$, In the vertical light emitting diode (VLED) die 10 (FIG. 1), the width W of the outer periphery of the electrode frame 24 can be optimized to provide enough current capacity to spread the current on the n-type semiconductor layer 20 from the outer periphery or sides to the center thereof. In addition, the four-sided, picture frame peripheral outline of the electrode frame 24 has an inner spacing d from the peripheral edge of the n-type semiconductor layer 20. The length L of electrode frame 24 can be selected to satisfy a required emission area. For example, the required emission area can be A, such that length L can be selected to be L=A/W. Depending on the brightness requirement, a longer L provides a larger emission area, A which can provide higher brightness.

Also in the vertical light emitting diode (VLED) die 10 (FIG. 1), the width W of the outer periphery of the electrode frame 24 can also be optimized to correspond to the lateral current spreading ability of the n-type semiconductor layer 20. For example, the current spreading ability of the n-type semiconductor layer 20 is dependent on electron conductivity, electron mobility, and thickness. A thicker n-type semiconductor layer 20 has more room to spread the current from the edge to the center. The electron conductivity, and mobility of the n-type semiconductor layer 20 is dependant on the optimization of doping concentration.

Also in the vertical light emitting diode (VLED) die 10 (FIG. 1), the thickness $d_E$ of the electrode frame 24 can range from 1 µm to 100 µm. A thicker $d_E$ provides the electrode frame 24 with a lower resistance to spread the current faster. In addition, higher current injection can provide higher brightness. Further, the uniform and fast current conduction on the optimized thickness $d_E$ of electrode frame 24 can avoid the local non-uniform high current density around the electrode 22. The local high current density around the electrode 22 can generate local high thermal density and damage the vertical light emitting diode (VLED) die 10. In other words, the optimized thickness of electrode frame 24 can help to spread not only current, but also any locally generated thermal hot spot can also be dissipated. Still further, a thicker electrode frame 24 can also provide lower resistance such that the operation voltage at high current can be reduced.

Figure 2A:
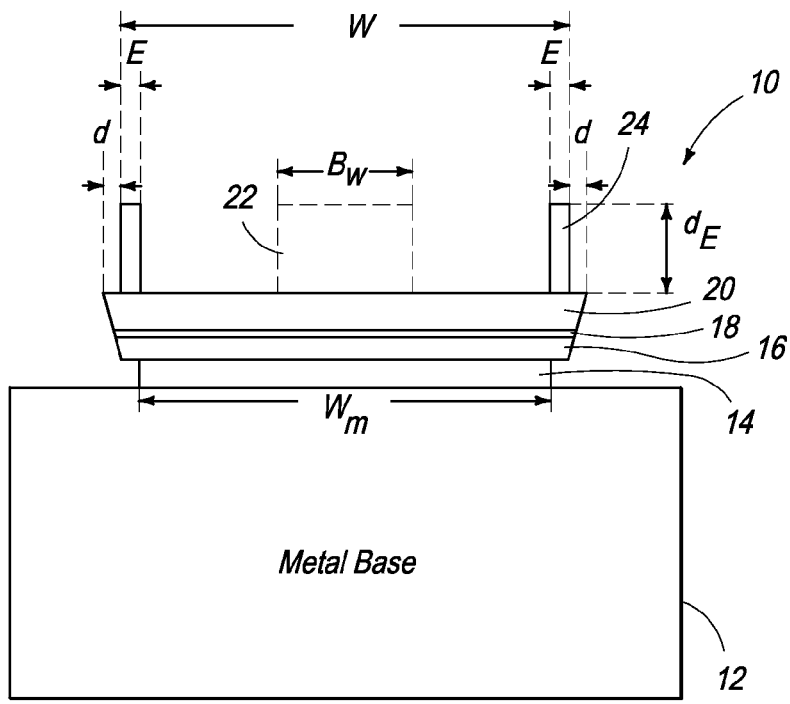
FIG. 2A is a schematic side elevation view of the vertical light emitting diode (VLED) die taken along the width side.
Figure 3A:
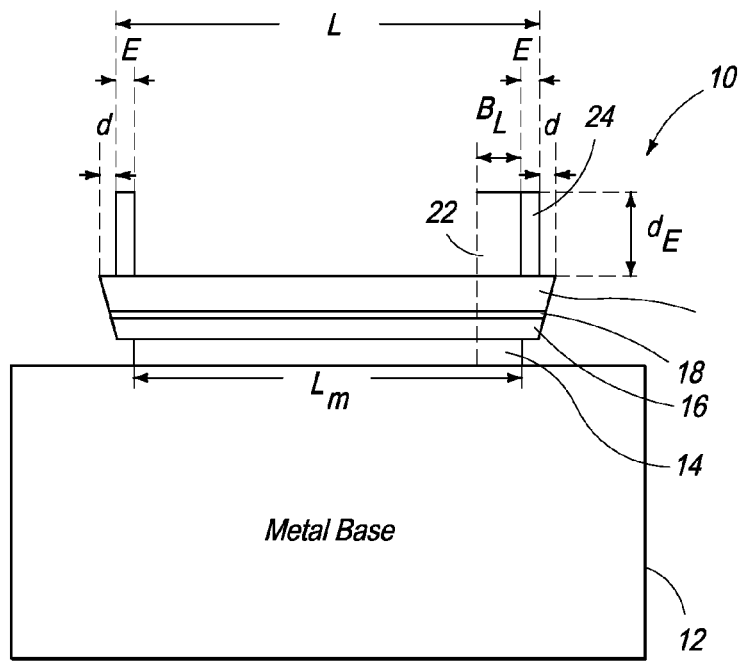
FIG. 3A is a schematic side elevation view of the vertical light emitting diode (VLED) die taken along the length side.

Referring to FIGS. 2A and 3A, in the vertical light emitting diode (VLED) die 10, the width $W_m$ of the mirror 14 is shown (where $W_m<W+2d$ or optionally $W_m=W$ or $W_m<W$). As shown in FIG. 3A, the mirror 14 also has a length $L_m$ and is spaced from the inner periphery of the electrode frame 24 (where $L_m<L+2d$ or optionally $L_m=L$ or $L_m<L$). The spacing of the mirror 14 from the electrode frame 24 is designed to provide a current blocking area for the electrode frame 24. In addition, the mirror 14 underneath the electrode 22 provides a current blocking area with almost no electron-hole recombination underneath of the electrode 22. This allows a higher current density and a higher brightness for a given emission area A.

Figure 2B:
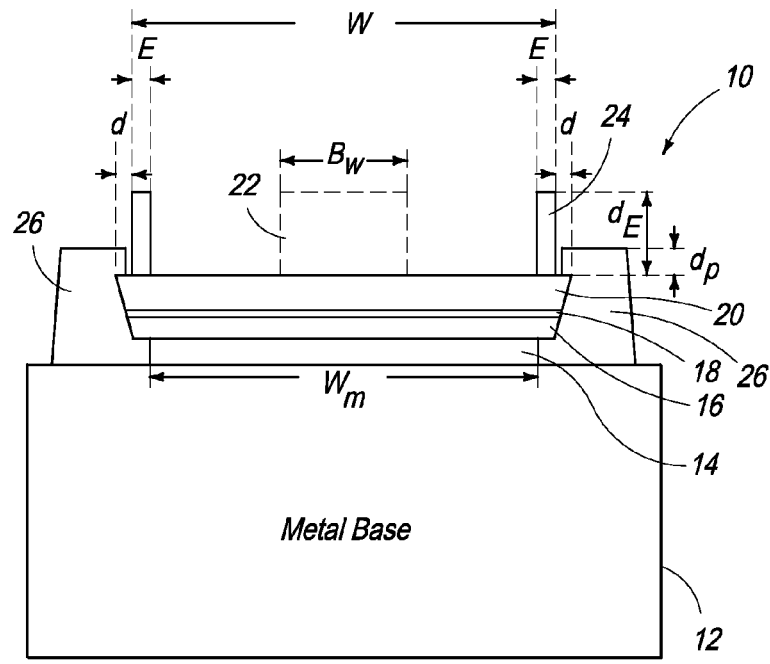
FIG. 2B is a schematic side elevation view equivalent to FIG. 2A of the vertical light emitting diode (VLED) die with a passivation layer.
Figure 3B:
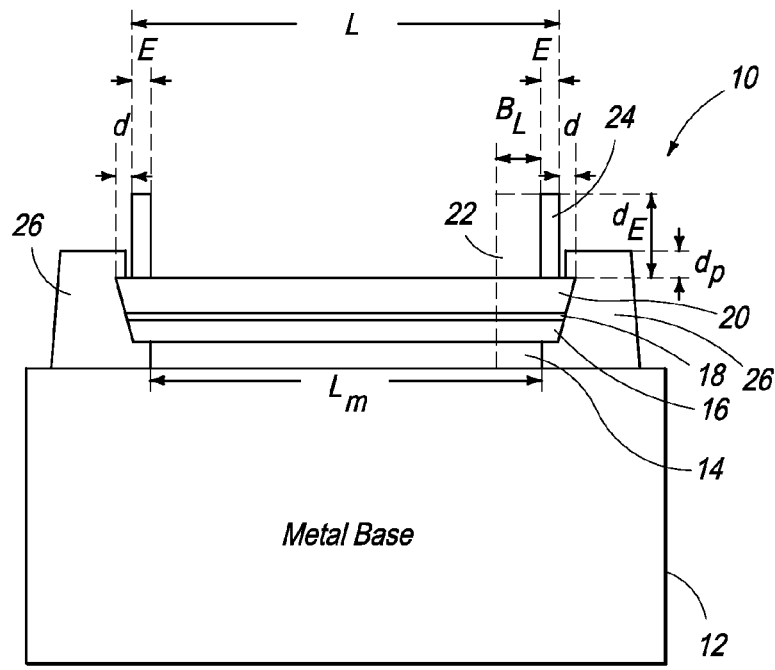
FIG. 3B is a schematic side elevation view equivalent to FIG. 3A of the vertical light emitting diode (VLED) die with a passivation layer.

Referring to FIGS. 2B and 3B, the vertical light emitting diode (VLED) die 10 can also include a passivation layer 26 formed on the metal base 12 surrounding and electrically insulating the electrode frame 24. In addition, the passivation layer 26 electrically insulates the edges of the mirror 14, the edges of the p-type semiconductor layer 16, the edges of the multiple quantum well (MQW) layer 18 and the edges of the n-type semiconductor layer 20. The passivation layer 26 can comprise an electrically insulating deposited material having a height of $d_p$ on the n-type semiconductor layer 20. (Optionally $d_p < d_E$, $d_p = d_E$, $d_p > d_E$) Suitable materials for the passivation layer 20 include photosensitive or non-photosensitive materials, resist, polymers, polyimide, epoxy, thermoplastics, parylene, dry film resist, silicone, SU8 and NR7.

Figure 4A:
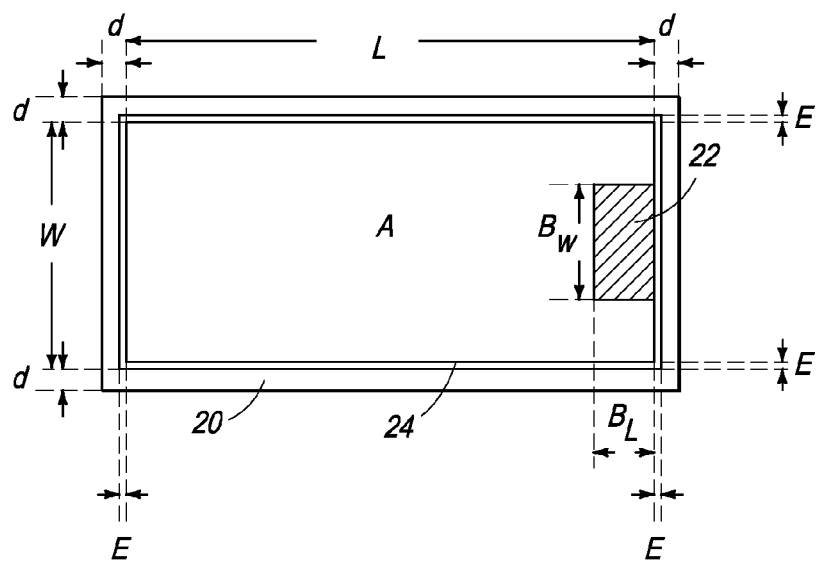
FIG. 4A is a plan view of the vertical light emitting diode (VLED) die illustrating the electrode frame and electrode.
Figure 4B:
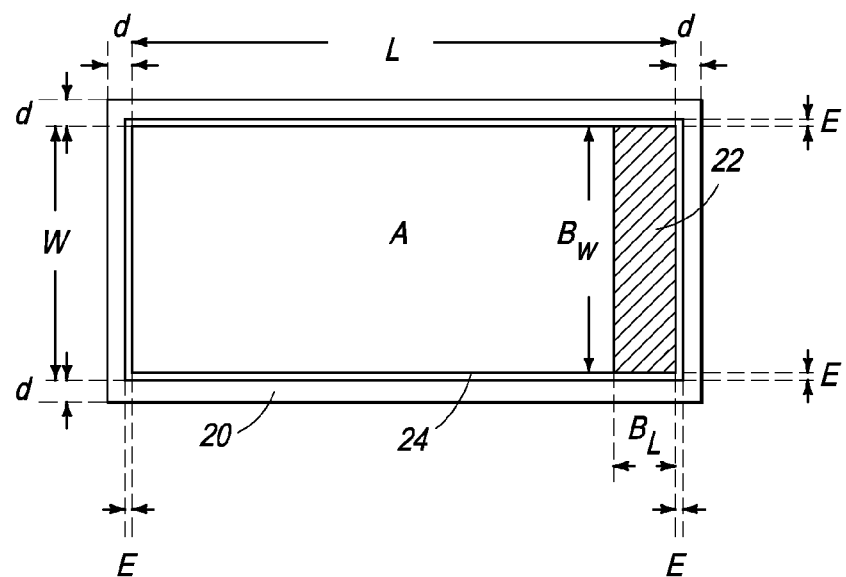
FIG. 4B is a plan view of the vertical light emitting diode (VLED) die illustrating an alternate embodiment with the electrode extending across the electrode frame.
Figure 4C:
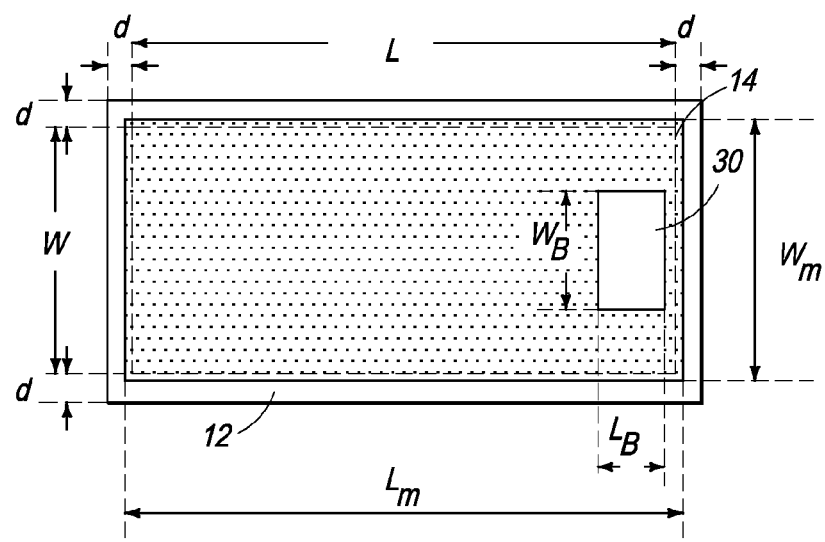
FIG. 4C is a plan view of the vertical light emitting diode (VLED) die illustrating the mirror.

Referring to FIGS. 4A-4C, additional features of the electrode frame 24, the electrode 22 and the mirror 14 are illustrated. As shown in FIG. 4C, the length $L_m$ of the mirror 014 can be smaller than that of the length L+2d (or optionally $L_m = L$ or $L_m < L$) and the $W_m$ of the mirror 14 can be smaller than that of the width W+2d (or optionally $W_m = W$ or $W_m < W$). In addition, the electrode current blocking area 30 (FIG. 4C) is dependant on the design of electrode 22. For example, $W_B$ has almost the same size as $B_W$, and $W_L$ has almost the same size as $B_L$. Optionally as shown in FIG. 4B, the electrode 22 can extend across the width of the electrode frame 24 and can be partially covered by the electrode frame 24.

Figure 5:
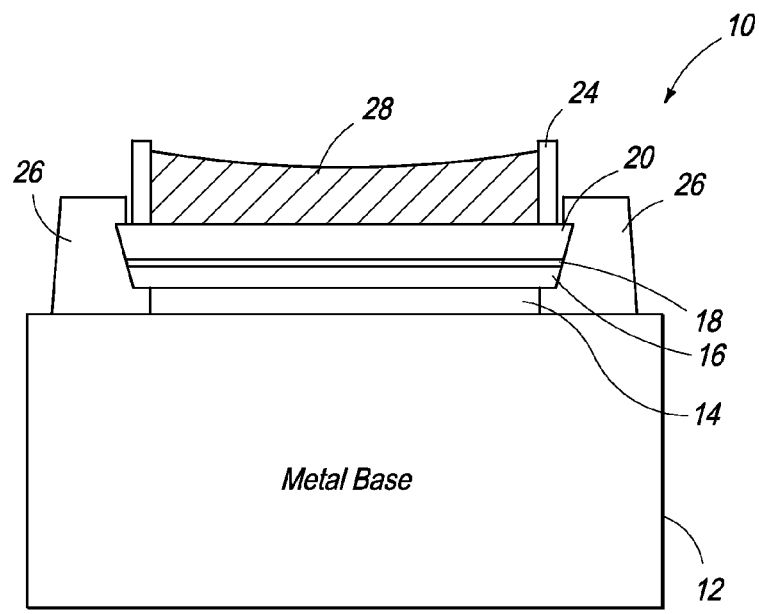
FIG. 5 is a schematic side elevation view of a vertical light emitting diode having a passivation layer and an organic or inorganic material within the electrode frame.

Referring to FIG. 5, the vertical light emitting diode (VLED) die 10 can also include an organic or inorganic material 28 contained within the electrode frame 24 having selected optical characteristics. In addition, the electrode frame 24 can be configured as a dam for containing the organic or inorganic material 28. In particular, the organic or inorganic material 28 is contained within the four sidewalls of the electrode frame 24 and by the upper surface of the n-type semiconductor layer 20. Also in this embodiment the height of the passivation layer 26 $d_p$ (FIG. 2B) is preferably less than the height $d_E$ (FIG. 1) of the electrode frame 24 ($d_p < d_E$). The organic or inorganic material 28 can comprise a light transmissive material such as silicone. In addition, the organic or inorganic material 28 can be selected to provide desired optical characteristics such as spectrum conversion or high reflective index.

Figure 6:
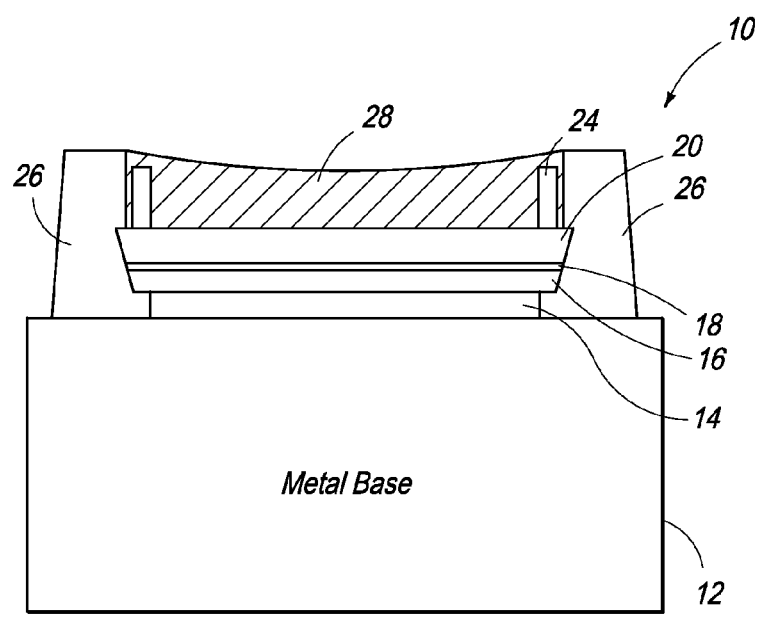
FIG. 6 is a schematic side elevation view of a vertical light emitting diode having a passivation layer configured as a dam and an organic or inorganic material contained within the dam.

Referring to FIG. 6, the vertical light emitting diode (VLED) die 10 can also include the organic or inorganic material 28 having selected optical characteristics contained within the passivation layer 26. Also in this embodiment the height of the passivation layer 26 $d_p$ (FIG. 2B) is preferably greater than the height $d_E$ (FIG. 1) of the electrode frame 24 ($d_p > d_E$). In addition, the passivation layer 26 can be configured as a dam for containing the organic or inorganic material 28. Further, the organic or inorganic material 28 can also encapsulate the electrode frame 28.

Figure 7:
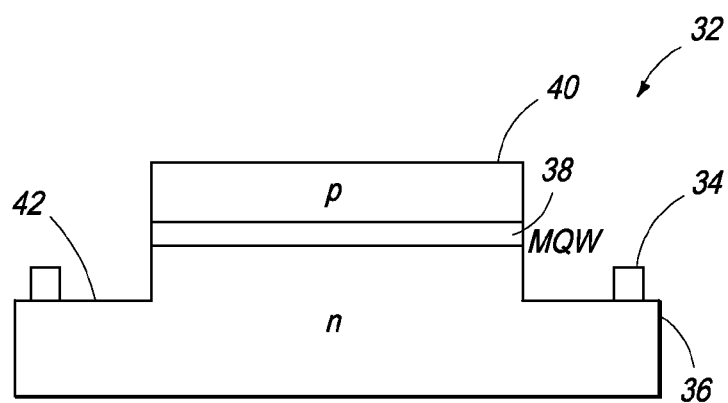
FIG. 7 is a schematic cross sectional view of a light emitting diode (LED) die having a peripheral electrode.
Figure 8:
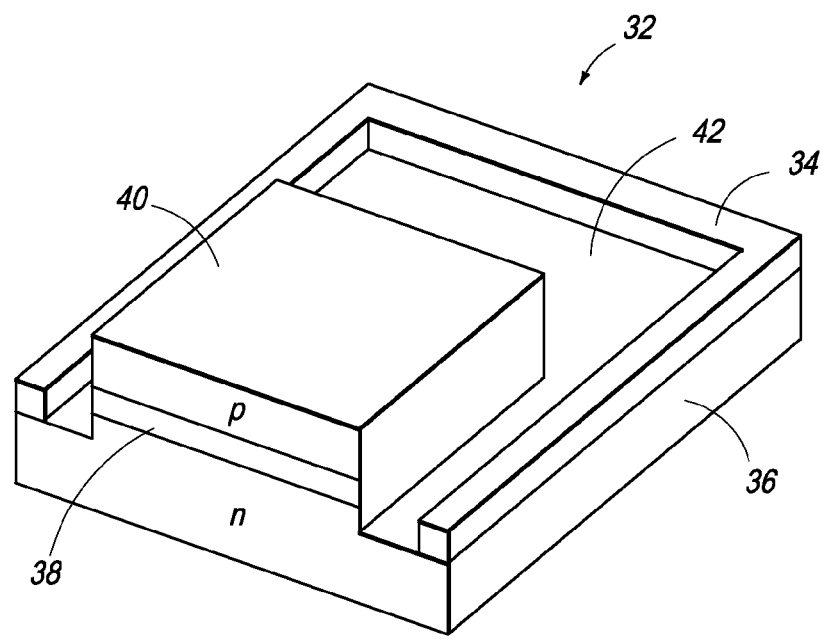
FIG. 8 is a schematic, partially cut away, perspective view of the light emitting diode (LED) die of FIG. 7.

Referring to FIGS. 7 and 8, a light emitting diode (LED) die 32 having a peripheral electrode 34 is illustrated. The light emitting diode (LED) die 32 includes an n-type semiconductor layer 36, a multiple quantum well (MQW) layer 38 in electrical contact with the n-type semiconductor layer 36 configured to emit electromagnetic radiation, and a p-type semiconductor layer 40 in electrical contact with the multiple quantum well (MQW) layer 38. The n-type semiconductor layer 36 and the p-type semiconductor layer 40 are configured as confinement layers for the multiple quantum well (MQW) layer 38. In the claims to follow, the n-type semiconductor layer 36 is referred to as a first-type semiconductor layer, and the p-type semiconductor layer is referred to as a second-type semiconductor layer. For simplicity, some elements of the light emitting diode (LED) die 32, such as the mirror 14 (FIG. 1) and the base 12 (FIG. 1) are not shown. In addition, the n-type semiconductor layer 36 can be formed on a sapphire layer (not shown) positioned on the mirror 14 (FIG. 1).

The n-type semiconductor layer 36 has an outer periphery, which is generally polygonal in shape, such as a rectangular or square shape, substantially as shown in FIG. 8. Alternately, the outer periphery of the n-type semiconductor layer 36 can have a circular or elliptical shape. In addition, the area of the n-type semiconductor layer 36 is greater than the area of the multiple quantum well (MQW) layer 38, and is also greater than the area of the p-type semiconductor layer 40, such that a stepped structure is provided. This stepped structure provides the n-type semiconductor layer 36 with a picture frame shaped surface 42 on which the peripheral electrode 34 is formed. In addition, this stepped structure and the surface 42 allow the peripheral electrode 34 to be spaced from the multiple quantum well (MQW) layer 38, which provides electrical isolation for the peripheral electrode 34.

In addition, the peripheral electrode 34 can be formed along the outer periphery of the n-type semiconductor layer 36 and can have a peripheral shape that substantially matches the outer periphery of the n-type semiconductor layer 36. The peripheral electrode 34 can be fabricated, shaped and dimensioned substantially as previously described for the electrode frame 24 (FIG. 1). For example, as shown in FIG. 8, the peripheral electrode 34 can have a peripheral shape and area that are smaller than the peripheral outline and area of the n-type semiconductor layer 36, but larger than the peripheral outline and area of multiple quantum well (MQW) layer 38 and the p-type semiconductor layer 40. Stated differently, the peripheral electrode 34 can have a peripheral length, a peripheral width and a peripheral area that are less than the length, the width and the area of the n-type semiconductor layer 36. In addition, the peripheral electrode 34 can have a peripheral length, a peripheral width and a peripheral area that are greater than the length, the width and the area of the multiple quantum well (MQW) layer 38. The peripheral electrode 34 at least partially enclose the multiple quantum well (MQW) layer 38, but preferably completely encloses the multiple quantum well (MQW) layer 38. In addition, the peripheral electrode 34 is spaced from the multiple quantum well (MQW) layer 38, which provides electrical isolation between the peripheral electrode 34 and the multiple quantum well (MQW) layer 38.

The peripheral electrode 34 functions substantially as previously described for the electrode frame 24 (FIG. 1) to spread current, but in this embodiment the electrode 22 (FIG. 1) is eliminated. In addition, one current spreading pattern can be as previously described from an outer periphery to a center of the n-type semiconductor layer 36. The peripheral electrode 34 also functions to dissipate heat substantially as previously described for the electrode frame 24 (FIG. 1).

Thus the disclosure describes an improved light emitting diode (LED) dice and method of fabrication. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A light emitting diode (LED) die comprising:
   a first-type semiconductor layer having a peripheral outline, a first area, a first width, a first length and a thickness;
   a multiple quantum well (MQW) layer on the first-type semiconductor layer configured to emit electromagnetic radiation having a second area less than the first area of the first-type semiconductor layer, a second width less that the first width of the first-type semiconductor layer and a second length less than the first length of the first-type semiconductor layer;
   a second-type semiconductor layer on the multiple quantum well (MQW) layer having a polarity opposite to that of the first-type semiconductor layer; and
   a peripheral electrode on the first-type semiconductor layer located proximate to the peripheral outline of the first-type semiconductor layer having a thickness $d_E$, a third width greater than the second width of the multiple quantum well (MQW) layer and a third length greater than the second length of the multiple quantum well (MQW) layer at least partially enclosing and spaced from the multiple quantum well (MQW) layer to provide electrical isolation from the multiple quantum well (MQW) layer, the peripheral electrode configured to spread current across the first-type semiconductor layer and with the thickness $d_E$ optimized as a function of the thickness of the first-type semiconductor layer to spread the current and dissipate heat.

2. The light emitting diode (LED) die of claim 1 wherein the peripheral electrode has a peripheral outline substantially matching the peripheral outline of the first-type semiconductor layer.

3. The light emitting diode (LED) die of claim 1 wherein the thickness $d_E$ of the peripheral electrode is from 1 μm to 100 μm.

4. The light emitting diode (LED) die of claim 1 wherein the first-type semiconductor layer comprises an n-type semiconductor and the second-type semiconductor layer comprises a p-type semiconductor.

5. The light emitting diode (LED) die of claim 1 wherein the first-type semiconductor layer comprises a material selected from the group consisting of GaN, AlGaN, InGaN and AlInGaN.

6. The light emitting diode (LED) die of claim 1 wherein the second-type semiconductor layer comprises a material selected from the group consisting of GaN, AlGaN, InGaN and AlInGaN.

7. The light emitting diode (LED) die of claim 1 wherein the first-type semiconductor layer is formed on a sapphire layer.

8. The light emitting diode (LED) die of claim 1 wherein the first-type semiconductor layer is formed on a sapphire layer on a mirror.

9. A light emitting diode (LED) die comprising:
   a first-type semiconductor layer having a surface, an outer periphery, a first area and a thickness;
   a multiple quantum well (MQW) layer on the first-type semiconductor layer having a second area less than the first area of the first-type semiconductor layer configured to emit electromagnetic radiation;
   a second-type semiconductor layer on the multiple quantum well (MQW) layer having the second area and a polarity opposite to that of the first-type semiconductor layer; and
   a peripheral electrode on the surface of the first-type semiconductor layer comprising a frame having a peripheral outline substantially matching the outer periphery of the first-type semiconductor layer and a thickness $d_E$, the peripheral electrode enclosing and spaced from the multiple quantum well (MQW) layer to provide electrical isolation from the multiple quantum well (MQW) layer, the peripheral electrode configured to spread current from the outer periphery towards a center of the first-type semiconductor layer and with the thickness $d_E$ optimized as a function of the thickness of the first-type semiconductor layer to spread the current and dissipate heat.

10. The light emitting diode (LED) die of claim 9 wherein the peripheral outline of the peripheral electrode has a polygonal shape.

11. The light emitting diode (LED) die of claim 9 wherein the first-type semiconductor layer, the multiple quantum well (MQW) layer and the second-type semiconductor layer form a stepped structure and the surface of the first-type semiconductor layer has a picture frame shape.

12. The light emitting diode (LED) die of claim 9 wherein the first-type semiconductor layer comprises an n-type semiconductor and the second-type semiconductor layer comprises a p-type semiconductor.

13. The light emitting diode (LED) die of claim 9 wherein the first-type semiconductor layer comprises a material selected from the group consisting of GaN, AlGaN, InGaN and AlInGaN.

14. The light emitting diode (LED) die of claim 9 wherein the second-type semiconductor layer comprises a material selected from the group consisting of GaN, AlGaN, InGaN and AlInGaN.

15. A method for fabricating a light emitting diode (LED) die comprising:
   providing a first-type semiconductor layer having a thickness and an outer periphery, a multiple quantum well (MQW) layer on the first-type semiconductor layer configured to emit electromagnetic radiation, and a second-type semiconductor layer on the multiple quantum well (MQW) layer having a polarity opposite to that of the first-type semiconductor layer; and
   forming an electrode on the first-type semiconductor layer along the outer periphery thereof with a thickness $d_E$ at least partially enclosing and spaced from the multiple quantum well (MQW) layer to provide electrical isolation from the multiple quantum well (MQW) layer, the peripheral electrode configured to spread current across the first-type semiconductor layer and with the thickness $d_E$ optimized as a function of the thickness of the first-type semiconductor layer to spread the current and dissipate heat.

16. The method of claim 15 wherein the peripheral electrode has a peripheral outline substantially matching the outer periphery of the first-type semiconductor layer.

17. The method of claim 15 wherein the electrode spreads current from the outer periphery towards a center of the first-type semiconductor layer.

18. The method of claim 15 wherein the first-type semiconductor layer comprises an n-type semiconductor and the second-type semiconductor layer comprises a p-type semiconductor.

19. The method of claim 15 wherein the first-type semiconductor layer comprises a material selected from the group consisting of GaN, AlGaN, InGaN and AlInGaN.

20. The method of claim 15 wherein the second-type semiconductor layer comprises a material selected from the group consisting of GaN, AlGaN, InGaN and AlInGaN.

\* \* \* \* \*